United States Patent [19]

Anderson

[11] Patent Number: 4,718,104
[45] Date of Patent: Jan. 5, 1988

[54] FILTER-SUBTRACT-DECIMATE HIERARCHICAL PYRAMID SIGNAL ANALYZING AND SYNTHESIZING TECHNIQUE

[75] Inventor: Charles H. Anderson, Somerset County, N.J.

[73] Assignee: RCA Corporation, Princeton, N.J.

[21] Appl. No.: 51,210

[22] Filed: May 15, 1987

Related U.S. Application Data

[63] Continuation of Ser. No. 774,984, Sep. 11, 1985, abandoned.

[30] Foreign Application Priority Data

Nov. 27, 1984 [GB] United Kingdom ................ 8429879

[51] Int. Cl.⁴ ............................................. G06K 9/36
[52] U.S. Cl. ..................................... 382/41; 358/133; 358/166; 382/43; 382/49; 364/723; 364/724; 364/725
[58] Field of Search ....................... 358/133, 160, 166; 382/17, 41–43, 49; 364/723, 724, 725, 728

[56] References Cited

U.S. PATENT DOCUMENTS 4,447,886 5/1984 Meeker .............................. 358/133

OTHER PUBLICATIONS

Rabiner, L. R. and Schafer R. W., "A Digital Signal Processing Approach to Interpolation", Proc. IEEE, vol. 61, No. 6, Jun. 1973, pp. 692–702.

Primary Examiner—Leo H. Boudreau
Assistant Examiner—Jose L. Couso
Attorney, Agent, or Firm—Allen LeRoy Limberg

[57] ABSTRACT

A pyramid frequency analyzing technique is taught in which an input sampled temporal signal is convolved with a spatially localized, gradual rolloff kernel weighting function, which is subtracted from the input signal in each pyramid stage prior to the convolved signal having its sample density decimated and applied as an input to the next pyramid stage (rather than subsequent to the convolved signal having its sample density decimated as in a Burt Pyramid analyzer). In addition, a synthesizing technique is taught which provides additional high-frequency peaking in each stage thereof, not provided by a Burt Pyramid synthesizer.

13 Claims, 4 Drawing Figures

FILTER-SUBTRACT-DECIMATE HIERARCHICAL PYRAMID SIGNAL ANALYZING AND SYNTHESIZING TECHNIQUE

CROSS REFERENCE

This is a continuation of application Ser. No. 774,984 filed Sept. 11, 1985 and now abandoned.

The present invention includes a species embodiment of a generic invention, which generic invention is disclosed and claimed in co-pending U.S. patent application Ser. No. 596,817, entitled "Real-Time Hierarchical Pyramid Signal Processing Apparatus," filed Apr. 4, 1984, by Carlson et al., and assigned to the same assignee as the present invention.

BACKGROUND OF THE INVENTION

1. Field of the Invention

This invention relates to hierarchical pyramid signal processing techniques for analyzing the frequency spectrum of an information component (having one or more dimensions) of a given temporal sampled signal having a highest frequency of interest no greater than $f_0$, and/or for synthesizing such a temporal signal from the analyzed frequency spectrum thereof. This technique may be implemented in delayed real time by apparatus employing pipe-line architecture of a type disclosed in the aforesaid co-pending Carlson et al. application. Although not limited thereto, the present invention is particularly suitable for image-processing in delayed real time the two-dimensional spatial frequencies of television images defined by a temporal video signal.

2. Description of the Prior Art

Prior to the present invention, Dr. Peter J. Burt developed an algorithm (hereinafter referred to as the "Burt Pyramid"), which he utilized to both analyze the spatial frequency spectrum of images and to synthesize an image from its analyzed sub-spectra. The Burt Pyramid algorithm (which uses particular sampling techniques discussed in some detail in the aforesaid co-pending Carlson et al. application) permits an original high-resolution image to be synthesized from component sub-spectra images without the introduction of spurious spatial frequencies due to aliasing. Originally, the Burt Pyramid algorithm was implemented by computer in non-real time. Non-real time implementation of the Burt Pyramid algorithm by computer processing is effective in processing fixed image information. However, it is not applicable to a stream of successively-occurring images which can be continually changing in time (e.g., successive video frames of a television picture). The generic invention which forms the subject matter of the aforesaid co-pending Carlson et al. application permits a real time implementation of both an analyzer and a synthesizer in accordance with the Burt Pyramid algorithm, as well as the real time implementation of just the analyzer of a filter-subtract-decimate (FSD) hierarchical pyramid which forms part of the subject matter of the present invention.

SUMMARY OF THE INVENTION

The FSD pyramid of the present invention is directed to both a novel analyzing technique and a novel synthesizing technique. While the prior-art Burt Pyramid synthesizer may be employed to synthesize a restored signal from the analyzed components derived from an FSD analyzer, the fidelity of the restored signal is significantly improved if the FSD synthesizer of the present invention is employed instead. More specifically, the FSD analyzer of the present invention is capable of analyzing the frequency spectrum of an n-dimensional information component, defined by the respective values of certain samples of an applied temporal-signal sample stream, into at leaest one bandpass subspectrum and a remnant subspectrum, where n is a given integer of having a value of at least one, and the certain samples of the applied sample stream define each of the n-dimensions of the information component with a particular relatively high sample density. The FSD analyzing technique involves convolving the certain samples of the sample stream with the symmetrical, localized, equal-contribution, low pass filter, n-dimensional kernel function having a low-pass transmission characteristic to derive a convolved sample stream. The convolved sample stream includes filtered samples that individually correspond to each and every one of the certain samples. The level of each of the filtered samples is subtracted from the level of that individual certain sample with which it corresponds to derive a first output sample stream that includes information-component samples corresponding to the certain samples that define the bandpass sub-spectrum with the particular relatively high sample density. Also, the convolved sample stream is decimated to derive a second output sample stream that includes information-component samples corresponding to only a given sub-multiple of the certain samples that define the remnant sub-spectrum with a relatively lower sample density in each dimension than the particular relatively high sample density.

The FSD synthesizing technique of the present invention involves first inserting zero-valued samples in the remnant subspectrum to expand the sample density in each dimension thereof to the sample density of the bandpass subspectrum. The signal resulting from this null-insertion step has a desired response component at the increased sample rate, but also has undesired image-response components. Second, the respective values of corresponding samples of this signal and this bandpass subspectrum are added to one another to provide a sum sample signal at the sampling density in each dimension of that of this bandpass subspectrum. Third, the sum signal is low-pass filtered in each dimension thereof to derive an interpolated-value sampled signal at the sampling density in each dimension of that of this bandpass subspectrum.

The low-pass filtering suppresses the undesired image-response components, thereby selecting the desired response component. The step of adding the bandpass spectrum to the expanded remnant subspectrum prior to this low-pass filtering step provides for high-frequency peaking of the desired response. The energy to provide this high-frequency peaking exists owing to the use of gradual roll-off filters in the FSD synthesizer. Because the bandpass spectrum is not sampled as sparsely as the remnant subspectrum before expansion, this high-frequency peaking desired from the bandpass spectrum is quite alias-free, much more than would be high-frequency peaking that could be derived from the remnant subspectrum itself. Fourth, respective values of corresponding samples of the bandpass subspectrum and the interpolated-value sampled signal are added to one another to derive an output sampled signal at the sampling density in each dimension of this bandpass subspectrum. The peaking components in the interpolated-value sampled signal cause the output sampled signal leter to match the corresponding sampled signal subjected to FSD analysis in order to derive the remnant subspectrum and the bandpass subspectrum. The peaking components flatten frequency response in the cross-over, from the low pass subspectrum provided by the low-pass filtering of the expanded remnant subspectrum, to the bandpass subspectrum.

DESCRIPTION OF THE PREFERRED EMBODIMENTS

As brought out in the aforesaid copending Carlson et al. application Ser. No. 596,817, the Burt Pyramid algorithm uses particular sampling techniques for analyzing a relatively high resolution original image into a hierarchy of N (where N is a plural integer) separate component images $L_0$ to $L_{N-1}$ (in which each component image is a Laplacian image preferably comprised of a different octave of the spatial frequencies of the original image) plus a remnant Gaussian image $G_N$ (which is comprised of all the spatial frequencies of the original image below the lowest octave component Laplacian image). The term "pyramid," as used herein, relates to the successive reduction in the spatial frequency bandwidth and sample density of each of the hierarchy of component images in going from the highest octave component image to the lowest octave component image.

A first advantage of the Burt Pyramid algorithm is that it permits the original high-resolution image to be syntehsized from the component images and the remnant image without the introduction of spurious spatial frequencies due to aliasing. A second advantage of the Burt Pyramid algorithm is that the spatial frequency bandwidth of one octave of each of the hierarchy of the component images matches the properties of the human visual system. This makes it possible to selectively process or alter the spatial frequencies of individual ones of the hierarchy of component images in different independent ways (i.e., without the signal processing of any one component image significantly affecting any other component image), in order to enhance or produce some other desired effect in the synthesized image derived from the processed component images.

The Burt Pyramid algorithm permits the original image to be restored, without aliasing, by an iterative procedure which involves successive steps of expanding the stored remnant image $G_N$ to the sampling density of the $L_{N-1}$ image and then adding it to the stored Laplacian image $L_{N-1}$ to derive a sum image. This sum image is expanded in a similar manner and added to the Laplacian image $L_{N-2}$, etc., until the original high-resolution image has been synthesized by the summation of all the Laplacian images and the remnant image.

The Burt Pyramid algorithm may be implemented in non-real time to process a fixed image comprised of a 2-dimensional spatial array of pixel samples by means of a digital computer. However, by employing the invention disclosed in the aforesaid co-pending Carlson et al., application, it is possible to implement the Burt Pyramid algorithm in delayed real time, so that it can be used to analyze a stream of successively-occurring images which can be continually changing in time (e.g., successive video frames of a television picture).

Figure 1A:
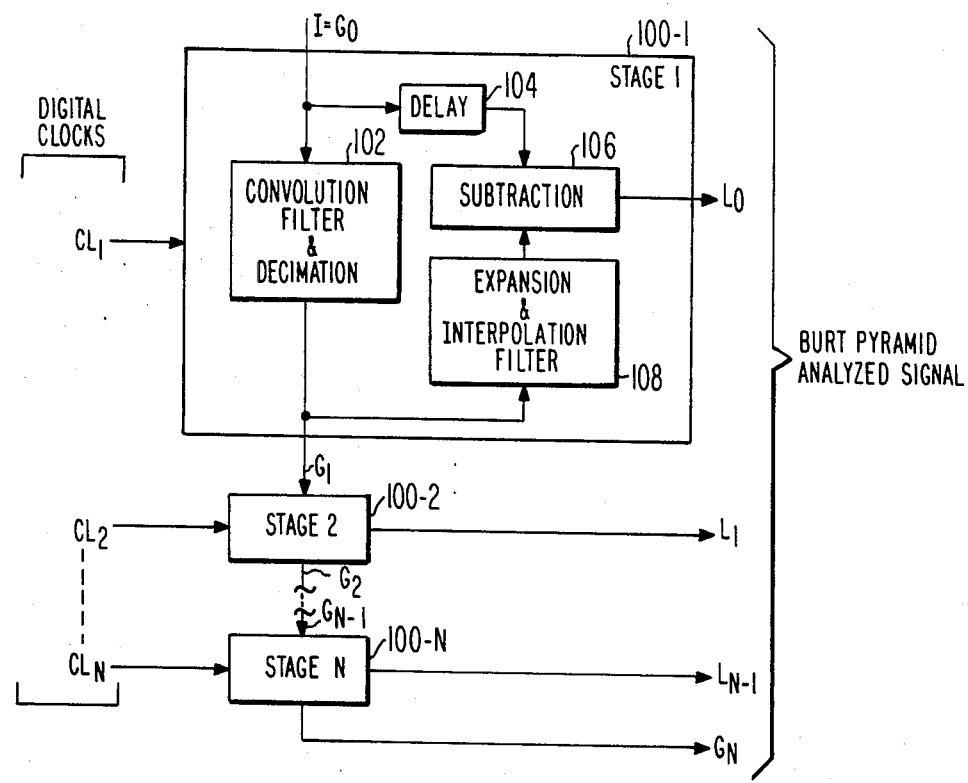
FIG. 1a is a functional block diagram of a Burt Pyramid spectrum analyzer.

FIG. 1a is a functional block diagram of a Burt Pyramid analyzer employing pipe-line architecture for analyzing in delayed real time the frequency spectrum of an information component of a given temporal signal, in which the highest frequency of interest of this frequency spectrum is no greater than $f_0$. The Burt Pyramid analyzer of FIG. 1a is a first species of Carlson et al. generic invention, which first species is both disclosed and specifically claimed in the aforesaid co-pending Carlson et al. patent application.

Referring to FIG. 1a, it is assumed that the input signal I (which is equal to the sampled signal $G_0$ of the aforesaid copending Carlson et al. patent application), is an image-manifesting signal in the form of a conventional video signal (e.g., an NTSC video signal) defining the spatial frequency spectrum of successively scanned two-dimensional television images, which video signal first has been prefiltered to remove any component thereof representing a spatial frequency higher than a given maximum spatial frequency $f_0$, and then has been sampled at a sampling frequency of at least twice $f_0$ and converted to a progressive scan format.

As indicated in FIG. 1a, the analyzer is comprised of a pipeline of generally similar sampled-signal translation stages 100-1, 100-2 . . . 100-N. Each of the respective stages operates at a sample frequency determined by the value of the digital clock $CL_1$, $CL_2$ . . . $CL_N$ individually applied thereto. The value of the clock applied to any particular one of the stages is lower than the value of the clock applied to any stage that precedes it. In the case of the present invention, the value of each of the clocks of stages 100-2 . . . 100-N is a sub-multiple of the clock of the immediately preceding stage.

As indicated in FIG. 1a, stage 100-1 is comprised of convolution filter and decimation means 102, delay means 104, subtraction means 106 and expansion and interpolation filter means 108. An input stream of digital samples $G_0$, having a sample frequency equal to the value of clock $CL_1$ is applied through convolution filter and decimation means 102 to derive an output stream of digital samples $G_1$ at a sample frequency equal to the value of clock $CL_2$. The convolution filter has a low pass function that reduces the center frequency of each image dimension represented by $G_1$ to one-half of the center-frequency of the corresponding dimension represented by $G_0$. At the same time, the decimation reduces the sample density in each dimension by one-half.

The respective digital samples of $G_0$ are applied through delay means 104 as a first input to subtraction means 106. At the same time, the reduced-density digital samples of $G_1$ are applied to expansion and interpolation filter 108, which increases the sample density of the $G_1$ samples back to that of $G_0$ by inserting zero-valued samples and then interpolating the result. Then, the expanded density interpolated $G_1$ samples are applied as a second input to subtraction means 106. The presence of delay means 104 ensures that each pair of samples of $G_0$ and $G_1$, which correspond to one another in spatial position, are applied to the first and second inputs of subtraction means 106 in time coincidence with one another. The output stream of successive samples $L_0$ from subtraction means 106 defines the highest spatial frequency in each dimension of the scanned image.

The structure of each of stages 100-2 ... 100-N is essentially the same as that of stage 100-1. However, each of the higher ordinal numbered stages 100-2 ... 100-N operates on lower spatial frequency signals occurring at lower sample densities than its immediately preceding stage. More specifically, the output stream of successive samples $L_1$ represents the next-to-highest octave of spatial frequencies in each image dimension, etc., so that, as indicated in FIG. 1a, the Burt Pyramid analyzed signal is comprised of respective octave sample streams $L_0 ... L_{N-1}$ (derived respectively from the substraction means of each of stages 100-1 ... 100-N) together with a low-frequency remnant signal $G_N$ (derived from the output of the convolution filter and decimation means of stage 100-N).

The respective convolution filters and interpolation filters employed by the Burt Pyramid analyzer of FIG. 1a are low pass filters that exhibit spatially localized, gradual rolloff characteristics, rather than "brick wall" rolloff characteristics. More specifically, each of the low pass filters employed by the Burt Pyramid anlayzer meets each of the following two constraints. First, each of these filters employs a localized, symmetric kernel weighting function composed of at least three multiplier coefficients. Second, the multiplier coefficients of the kernel weighting function provide equal contribution; that is, all nodes at a given level contribute the same total weight to nodes at the next higher level. In the case of a three-tap filter, this means that the respective values of the three weighting multiplier coefficients of the kernel function of the filter in each dimension are respectively 0.25, 0.5, and 0.25. In the case of a five-tap filter, the values so the five weighting multiplier coefficients of the kernel function of the filter in each dimension are respectively $(0.25-p/2)$, 0.25, p, 0.25, and $(0.25-p/2)$, where p has a positive value.

As discussed in more detail in the co-pending Carlson et al. application, one or more of the Burt Pyramid analyzed signals $L_0, L_1 ... L_{M-1}, G_N$ may be passed through an alteration circuit prior to it being applied to a Burt Pyramid synthesizer for the purpose of deriving a reconstituted output sampled signal $I_R$. Further, corresponding samples of $L_0, L_1 ... L_{N-1}$ and $G_N$ do not occur isochronously, but are time-skewed with respect to one another. This is because each of the successive stages of the Burt Pyramid analyzer inserts a delay between its Gausian input and its respective Gausian and Laplacian outputs, which delays are cumulative.

Figure 1B:
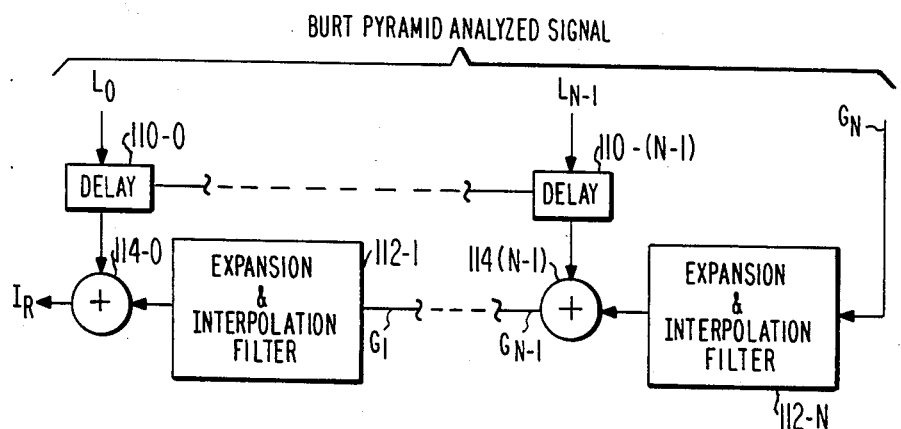
FIG. 1b is a functional block diagram of a Burt Pyramid synthesizer.

Referring to FIG. 1b, there is shown a Burt Pyramid synthesizer for deriving the reconstituted output sampled signal $I_R$. This is accomplished by the use of appropriate delay means 110-0 ... 110-(N-1) operating on the sample streams $L_0 ... L_{N-1}$, together with expansion and interpolation filters 112-1 ... 112-N (each of which is similar to expansion and interpolation filter 108 of FIG. 1a, discussed above) and summers 114-0 ... 114-(N-1). As indicated, the lowest density remnant sample stream $G_N$ has its sampling density doubled in each of its n dimension (e.g., spatial dimensions of a 2-D image) by expansion and interpolation filter 112-N, and is then added to a delayed sample stream $L_{N-1}$ by the summer 114-(N-1). By iteration of this process, through successive synthesis stages, the reconstituted output signal $I_R$, defining the two dimensional image at the high sample density of the original image-representing sampled signal I, is derived. The purpose of each of delays means 110-0 ... 110-(N-1) is to ensure that the respective of $L_0 ... L_{N-1}$ samples applied as second inputs to corresponding ones of summers 114-0 ... 114(N-1) occur isochronously with their respective corresponding samples applied to the first input of summers 114-0 ... 114(N-1) from the output of corresponding ones of expansion and interpolation filters 112-1 ... 112-N.

For reasons discussed in detail of the aforesaid Carlson et al. application, the use of low pass filters having relatively gradual rolloff characteristics, rather than "brick wall" rolloff characteristics, in both the Burt Pyramid analyzer and the Burt Pyramid synthesizer can be tolerated because the overall effect of the Burt Pyramid analyzer and synthesizer, operating together is to compensate for frequency distortion (including frequency aliasing) caused by the gradual rolloff characteristics of the low-pass filters employed by the Burt Pyramid. This is one of the main advantages of the Burt Pyramid.

Figure 2A:
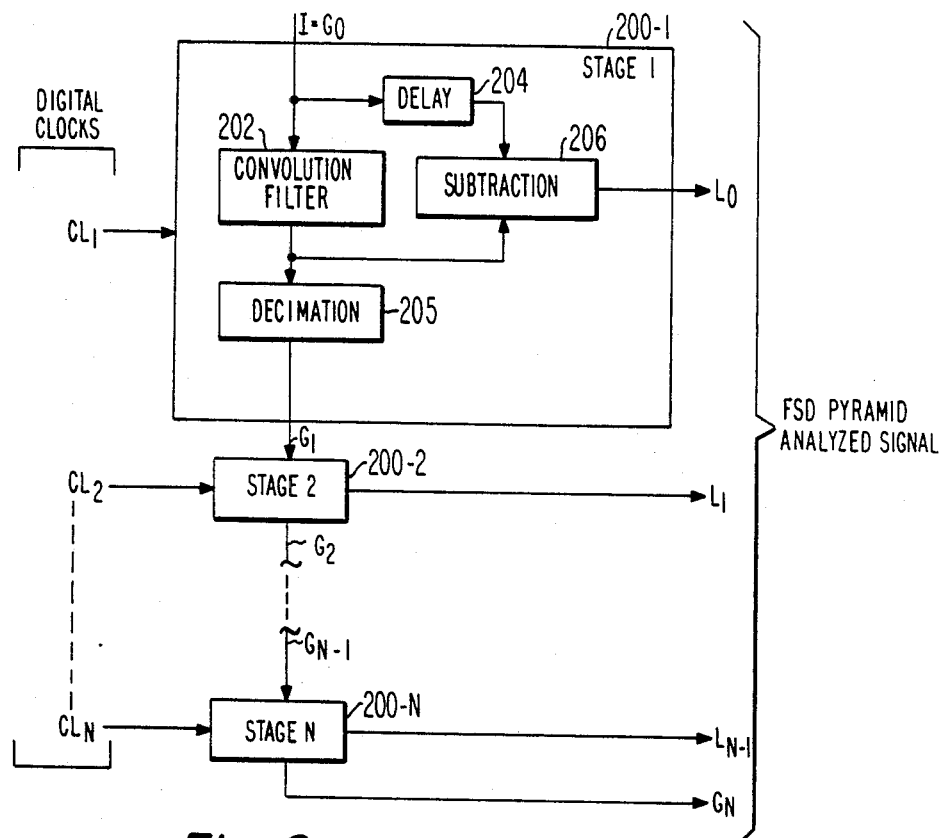
FIG. 2a is a functional block diagram of an FSD spectrum analyzer.

Referring to FIG. 2a, there is shown a delayed real time implementation of an FSD pyramid spectrum analyzer of the present invention, which comprises a second species embodiment of the Carlson et al. generic invention. This FIG. 2a implementation of the FSD pyramid spectrum analyzer is disclosed, but is specifically disclaimed, in the aforesaid co-pending Carlson et al. patent application. In general, the FSD pyramid analyzer of FIG. 2a is similar to that of the Burt Pyramid analyzer of FIG. 1a. Each N of stages 200-1 ... 200-N of the FSD pyramid analyzer shown in FIG. 2a correspond with the N stages 100-1 ... 100-N of the Burt Pyramid analyzer of FIG. 1a. More specifically, respective digital clocks $CL_1 ... CL_N$, in FIG. 2a are identical in all respects to the digital clocks $CL_1 ... CL_N$ described above in connection with FIG. 1a. Further, the FSD pyramid analyzer of FIG. 2a, like the Burt Pyramid analyzer of FIG. 1a, analyzes the frequency spectrum of an image-manifesting signal I, defined by the samples of temporal signal $G_0$, into Laplacian sub-spectra sampled signals $L_0 ... L_{N-1}$ and remnant sampled signal $G_N$.

However, the components of each of stages 200-1 ... 200-N of the FSD pyramid analyzer of FIG. 2a are somewhat differently arranged from the components of respective stages 100-1 ... 100-N of the Burt Pyramid analyzer of FIG. 1b. Specifically, in the FSD pyramid analyzer of FIG. 2a, the convolved output of convolution filter 202 is applied directly to subtraction means 206, prior to having its sample density in each dimension reduced by decimation means 205. This differs from the case of the Burt Pyramid analyzer of FIG. 1a, in which convolution filter and decimation 102 decimates the output of the convolution filter (thereby reducing its sampling density in each dimension thereof) prior to it being forwarded to subtraction means 106 through expansion and interpolation filter 108. The reason for this is that, in the case of the Burt Pyramid analyzer of FIG. 1a, expansion and interpolation filter 108 is required to restore the sampling density in each dimension of the output of convolution and decimation means 102 to the sampling density in each dimension of the input thereto prior to its application to subtraction means 106.

Thus, the significant structural difference between the two pyramid analyzers, is that the FSD pyramid analyzer of FIG. 2a can dispense with an expansion and interpolation filter in each stage thereof, thereby significantly reducing the amount of hardware required to implement the analyzer as well as reducing the inherent delay produced by the presence of such expansion and interpolation filters in each of the respective stages of the Burt Pyramid analyzer. On the other hand, the FSD pyramid analyzer of FIG. 2a does not inherently compensate for frequency distortion resulting from the use of gradual rolloff low pass filters (discussed above in connection with the Burt Pyramid analyzer) in convolution filter 202 of each stage thereof.

The Burt Pyramid synthesizer of FIG. 1b may be utilized to synthesize a reconstructed image-manifesting signal $I_R$ in response to the application thereto of the FSD pyramid analyzed signal of the FSD pyramid analyzer of FIG. 2a. However, because frequency distortion is not compensated for in the FSD pyramid analyzer, the reconstructed image derived from a Burt Pyramid synthesizer will be "softer" than the original analyzed image represented by the image-manifesting signal I applied to the FSD pyramid analyzer (i.e., high spatial frequency detail in the original, including edges, will be attentuated in the reconstructed image). Such undesirable attenuation of high frequency detail can be substantially eliminated by the use of the FSD pyramid synthesizer shown in FIG. 2b (rather than the FIG. 1b synthesizer).

In accordance with the present invention, it has been found that an FSD pyramid analyzed signal can be reconstructed without introducing frequency distortion when the FSD synthesizing process conforms with the following equations:

$$G_{K-1} = L_{K-1} + H[L_{k-1} + G_K^S] - C_{K-1} \quad (1);$$

$$C_{K-1} = [1 + H + H^2 + \ldots][G_K^S - Y_K]H \quad (2);$$

$$Y_K = G_K + H(G_K^*) \quad (3);$$

$$G_K^S = G_K + G_K^* \quad (4);$$

where K has a value between 1 and N, $G_{K-1}$ is the Gaussian input to stage K of the FSD pyramid analyzer; $L_{K-1}$ is the Laplacian output of this stage K, H is the kernel weighting function of the convolution filter of this stage K; $G_K^S$ is the decimated (sub-sampled) output of this stage K; $C_{K-1}$ is a correction term for this stage K; $Y_K$ is defined by equation 3; $G_K$ is the convolved output of this stage K prior to decimation; and $G_K^*$ represents the aliasing spurious frequencies introduced by the decimation (sub-sampling) of $G_K$.

As discussed in detail in the aforesaid co-pending Carlson et al. application, the Burt Pyramid synthesizing process allows perfect reconstruction, despite the presence of aliasing. In order to approach perfect reconstruction in the FSD synthesis process, it would be necessary to employ at least several of the terms of the infinite series of terms set forth in equation 2 (that defines the correction term $C_{K-1}$ for each synthesizer stage, which correction term $C_{K-1}$ is included in equation 1).

In the case of a non-real time implementation of the present invention employing a digital computer, the inclusion of the correction term $C_{K-1}$ severely increases the amount of computation required to reconstruct the synthesized image-manifesting signal $I_R$. In the case of a delayed real time implementation of the present invention, the inclusion of the correction term $C_{K-1}$ greatly increases the amount of hardware required (and, thus, is not practical). However, in accordance with the present invention, it has been found that the correction term $C_{K-1}$ may be omitted without the introduction of any significant amount of frequency distortion in the reconstructed signal, if each of the convolution filters of the FSD pyramid analyzer (FIG. 2a) and each of the interpolation filters of the FSD pyramid synthesizer (FIG. 2b) employs separable filters for each of its n dimensions (e.g., two dimensions), and each of the separable filters is a five-tap filter employing a kernel weighting function in which the central tap has a value of between 0.3 and 0.4. Therefore, in a practical FSD pyramid synthesizer, in which the correction term $C_{K-1}$ is neglected, equation 1 reduces to equation 5, set forth below:

$$G_{K-1} = L_{K-1} + H[L_{K-1} + G_K^S] \quad (5).$$

Figure 2B:
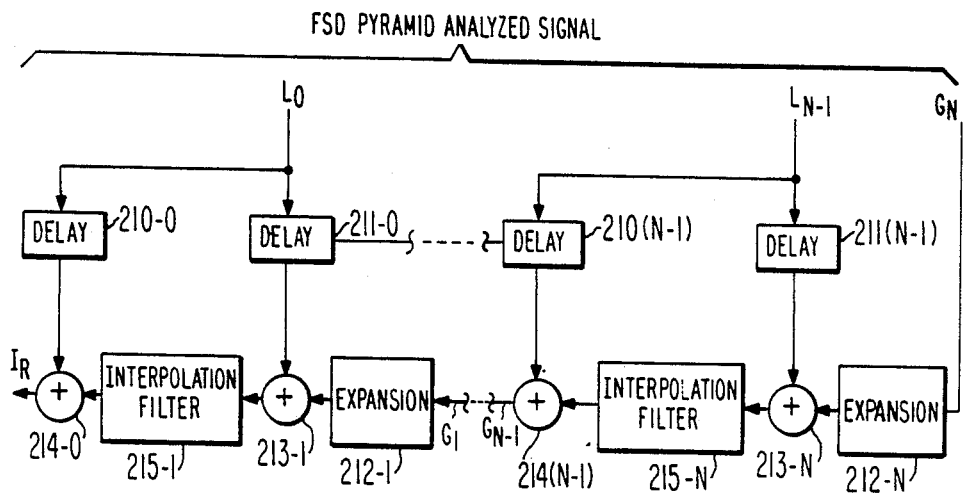
FIG. 2b is a functional block diagram of an FSD synthesizer.

The FSD pyramid synthesizer shown in FIG. 2b for operating in delayed real time on an FSD analyzed signal derived from an FSD pyramid analyzer of a type shown in FIG. 2a, which conforms with equation 5.

As indicated in FIG. 2b, the remnant subspectrum sampled signal $G_N$ is passed through expansion means 212-N (which inserts zero-valued samples therein to raise its sampling density to that of subspectrum sampled signal $L_{N-1}$) and is then applied as a first input to summer 213-N. The $L_{N-1}$ subspectrum sampled signal is applied through delay means 211(N−1) and applied to a second input of summer 213-N. The purpose of delay means 211(N−1) is to ensure that each of the $L_{N-1}$ subspectrum samples applied to second input of summer 213-N occurs in time coincidence with its corresponding sample applied to the first input of summer 213-N from the output of expansion means 212-N. In the case of the each $G_N$ remnant signal sample appearing at the output of expansion means 212-N, the value of the sample appearing at the output of summer 213-N is equal to the sum of the respective values of that $G_N$ sample and its corresponding $L_{N-1}$ sample. However, in the case of each zero-valued sample appearing at the output of expansion means 212-N, the value of the output sample from summer 213-N has a value equal to only that of the $L_{N-1}$ sample which corresponds with that zero-valued sample. Interpolation filter 215-N, which is a low-pass filter preferably having a gradual rolloff and employing a spatially-localized kernel weighting function in each of N dimensions (e.g., two dimensions) having five coefficient multipliers, in which the value of the central coefficient multiplier is between 0.3 and 0.4. The output from interpolation filter 215-N is applied as a first input to summer 214(N−1) and the $L_{N-1}$ subspectrum sampled signal is applied through delay means 210(N−1) as a second input to summer 214(N−1). Delay means 210(N−1) and summer 214(N−1) correspond respectively in function and structure with each of delay means 110(N−1) and summer 114(N−1). Delay means 214(N−1) provides a longer delay than does delay means 211(N−1) in order to compensate for the delay inserted by interpolation filter 215-N. Delay means 210(N−1), delay 211(N−1), expansion means 212-N, summer 213-N, summer 214(N−1) and interpolation filter 215-N, together form stage N of an ordinally-arranged set of FSD pyramid synthesizer stages 1 ... N. Each of stages 1 ... (N−1) of this set is comprised of structure which corresponds (except in sampling density) to that of stage N, and the output of each subsequent stage of the set is applied as an input to its immediately preceding stage (as is indicated in FIG. 2b). The resulting output of summer 214-0 of the first stage of the set is the reconstructed sampled image-manifesting signal $I_R$.

By comparing FSD pyramid synthesizer of FIG. 2b with the Burt Pyramid synthesizer of FIG. 1b, it is plain that the FSD pyramid synthesizer provides additional high-frequency peaking. This high-frequency peaking is needed in each stage of the FSD pyramid synthesizer to restore energy loss that would otherwise take place when an expanded sampled Gaussian input signal (e.g., $G_N$, $G_{N-1}$ . . . is passed through a gradual rolloff characteristic low-pass interpolation filter. While the Burt Pyramid synthesizer also employs an expansion and interpolation filter in each stage, no high-frequency peaking is required in this case. This is because, in each stage of the Burt Pyramid analyzer, the presence of an expansion and interpolation filter provides an energy loss in the filtering of the expanded sample density $G_K$ sampled signal. When samples of the expanded and filtered $G_K$ sampled signal are then subtracted from the corresponding samples of the $G_{K-1}$ sampled signal by the subtraction means of stage K of the Burt Pyramid analyzer, the resulting bandpass (difference) subspectrum sampled signal $L_{K-1}$ has its energy enhanced in this frequency range in which energy loss occurred in the $G_K$ sampled signal. Due to the subtraction process, this energy enhancement is inherently just equal and opposite to the energy loss that takes place in the $G_K$ signal in passing through the expansion and interpolation filter of stage K of stage K of the Burt Pyramid synthesizer. Thus, the need for high frequency peaking in each stage of the FSD pyramid synthesizer arises because of the absence of any expansion and interpolation filter in each stage of the FSD pyramid analyzer.

Further, the combined effect at the gradual rolloff characteristic convolution filter together with the decimation process (employed in both the respective stages of the Burt and the FSD pyramid analyzers), puts a copy of the lower frequencies of the information component (e.g., the spatial frequencies of a two dimensional image) at a point that would appear roughly in the middle of the bandpass subspectrum of the $L_K$ sampled signal output from stage K. The frequencies included in this copy comprise spurious aliasing frequencies. However, the expansion and interpolation filter employed in each of the Burt Pyramid analyzer stages strongly rejects in this frequency range, thereby substantially preventing aliasing energy from actually appearing in the $L_K$ sampled signal output from stage K thereof. Expansion and interpolation filter is absent in each of the FSD analyzer stages, the aliasing remains in the $L_K$ sampled signal output from stage $L_K$ of the FSD pyramid analyzer. However, the aliasing energy is small and can be tolerated using the FSD pyramid synthesizer of FIG. 2b (assuming that it conforms with equation 6). Aliasing energy in the reconstructed image-manifesting signal $I_R$ can be reduced even further to the extent that equation 1 is utilized to provide FSD synthesis of the reconstructed signal (i.e., the more terms of the series $[1+H+H^2 + . . .]$, defining the correction term $C_K$ shown in equation 2, that are employed, the more the aliasing will be reduced by the FSD synthesis process).

What is claimed is:

1. A filter-subtract-decimate (FSD) method for analyzing the frequency spectrum of an n-dimensional information component, defined by respective level-values of certain samples of an applied temporal-signal sample stream, into at least one bandpass sub-spectrum and a remnant sub-spectrum, where n is a given integer having a value of at least one, said certain samples of said applied sample stream defining each of said n-dimensions of said information component with a particular relatively high sample density; said FSD method comprising the steps of:

(a) convolving said certain samples of said sample stream with a symmetrical, localized, equal-contribution, low-pass filter, n-dimensional kernel function having a low-ass transmission characteristic to derive a convolved sample stream, said convolved sample stream including filtered samples that individually correspond to each and every one of said certain samples;

(b) subtracting a level-value of each of said filtered samples from a level-value of that individual certain sample with which it corresponds to derive a first output sample stream that includes information-component samples corresponding to said certain samples that define said bandpass sub-spectrum with said particular relatively high sample density, and (c) decimating said convolved sample stream to derive a second output sample stream that includes information-component samples corresponding to only a given sub-multiple of said certain samples that define said remnant sub-spectrum with a relatively lower sample density in each dimension than said particular relatively high sample density.

2. The method defined in claim 1, further comprising the step of:
   substituting said second output sample stream for said applied temporal-signal sample stream and repeating at least steps (a) and (b) on said substituted sample stream.

3. The method defined in claim 1, further comprising the step of:
   substituting said second output stream for said applied temporal-signal sample stream and repeating steps (a), (b) and (c) on said substituted sample stream.

4. In signal processing apparatus employing pipe-line architecture for analyzing in delayed real time the frequency spectrum of an information component of a given temporal signal, wherein said component corresponds to information having a given number of dimensions, and wherein said frequency spectrum has a highest frequency of interest no greater than a frequency $f_0$; said apparatus comprising: a set of N ordinally arranged sampled-signal translation means (where N is a plural integer), each one of said translation means including first and second input terminals and first and second output terminals; said first input terminal of each one of said second to said Nth translation means of said set being coupled to said first output terminal of the immediately preceding one of said translation means of said set for forwarding a signal from each one of said translation means to its immediately following one of said translation means of said set; means for applying said given temporal signal to said first input terminal of the first translation means of said set; and means for applying a separate sampling frequency clock to the second input terminal of each one of said translation means of said set to derive a sample rate for respective signals derived at said first and second output terminals of that translation means equal to the sampling frequency of the clock applied thereto; wherein:

each one of said translation means of said set exhibits for said information component a low-pass transfer function between its first input terminal and its first output terminal, said low-pass transfer function of each translation means of said set having a nominal cut-off frequency that is a direct function of the sampling frequency of the clock applied to the second input terminal of that one of said translation means of said set;

the clock applied to the second input terminal of said first translation means of said set has a sampling frequency that (1) is twice $f_0$, and (2) provides for said information component a nominal cut-off frequency for said low-pass transfer function of said first translation means of said set which is less than $f_0$;

the clock applied to the second input terminal of each one of said second to Nth translation means of said set has a sampling frequency that (a) is less than the clock frequency applied to the second input terminal of the immediately preceding one of the translation means of said set, (b) is at least equal to twice the maximum frequency of the information component of the signal applied to its first input terminal, and (c) provides a nominal cut-off frequency for its low-pass transfer function which is less than that of its immediately preceding translation means of said set;

the information component of a signal derived at said second output terminal of each one of said translation means of said set corresponds to the difference between the information component of a signal applied to said first input terminal thereof and a direct function of the information component of a signal derived at the first output terminal thereof;

each one of said translation means of said set is comprised of first means coupled to the first and second input and first output terminals of that one translation means for providing said low-pass transfer function of that one translation means: said first means including an m-tap convolution filter (where m is a given plural integer) for convolving the information component of the signal applied to the first terminal of that one translation means with a predetermined kernel function at a sampling frequency corresponding to that of the clock applied to the second input terminal of that one translation means, said predetermined kernel function and said sampling frequency of the convolution filter of that one translation means defining respectively the shape and nominal cut-off frequency of the low-pass transfer function of that one translation-means in each dimension of said information component; second means coupled to said first means and to the second input and second output terminals of that one translation means for deriving a difference signal at the second output terminal of that one translation means; said second means including sample-subtractive means and third means comprising delay means for coupling said sample-subtractive means through said delay means to said first means for subtracting in temporal alignment, at the sampling frequency of the convolved samples of that one translation means, each of successively-occurring respective sample levels of convolved samples of that one translation means from each of corresponding successively-occurring respective levels of the information component of the signal applied to the first input terminal of that one translation means prior to its being convolved with said predetermined kernel function of the convolution filter of that one translation means, whereby said sample-subtracting means output comprises each of successively-occurring respective difference sample levels, at the sampling frequency of the convolved samples of that one translation means, said respective difference sample levels constituting the information component of the signal derived at the second output terminal of that one translation means;

said first means of at least one of said translation means of said set being comprised of said convolution filter and a decimator serially coupled between the output of said convolution filter and the first output terminal of that one of said translation means of said set; said convolution filter of said given type of first means derives at its output a particular sample density in each dimension of said information component that corresponds with the sampling frequency of the clock applied to the second input terminal of that one translation means, and said decimator of said first means of said one translation means forwards, in each of said dimensions of said information component, only certain ones, but not all, of the convolved samples appearing at the output of the convolution filter of said first means of said one translation means to said first output terminal of that one translation means, whereby said convolved samples, in each of said dimensions of said information component at said first output terminal of that one translation means, has a decimated sample density that is reduced with respect to their particular sample density of the corresponding dimension of said information component at the output of the convolution filter of that one translation means; The improvement wherein:

said third means further includes fourth means coupled to the junction between said convolution filter and said decimator and to said sample-subtracting means for applying said convolved samples in each dimension of said information component at their particular sampling density of that one translation means to said sample-subtracting means.

5. The apparatus defined in claim 4, wherein each of a first to an (N−1)th translation means of said set includes a first means that is comprised the same as said first means of said one translation means is comprised and also includes said fourth means.

6. The apparatus defined in claim 5, wherein said Nth translation means of said set also includes a first means that is comprised the same as said first means of said one translation means is comprised and also includes said fourth means.

7. The apparatus defined in claim 4, wherein said decimator of said first means of said translation means forwards, in each of said dimensions of said information component, every other one of the samples appearing at the output of the convolution filter of said first means of said one translation means to said first output terminal of that one translation means, whereby said decimated sample density, in each of said dimensions of said information component, is reduced to one-half said particular sample density of the corresponding dimension of said information component.

8. The apparatus defined in claim 4, wherein said predetermined kernel function of at least one of said translation means of said set defines a low-pass transfer-function shape for that translation means having a gradual roll-off that extends beyond said nominal cut-off frequency thereof.

9. A synthesizing method, for responding to an ordinally-arranged set of N, where N is a plural-integer, separate temporal sampled signals that have been derived by analyzing the frequency spectrum of an information component having a given number of dimensions of a first single temporal sampled signal according to a filter-subtract-decimate (FSD) pyramid analysis procedure, to synthesize a second signal temporal sampled signal that corresponds to said first temporal sampled signal; wherein the first $(N-1)$ sampled signals of said ordinally-arranged set are contiguous bandpass sub-spectra sampled signals of said frequency spectrum starting with that bandpass subspectrum sampled signal defining the highest frequency band of said frequency spectrum, and an Nth sampled signal of said ordinally-arranged set is comprised of a remnant sub-spectrum sampled signal that includes all frequencies of said frequency spectrum lower than those contained in the $(N-1)$th bandpass sub-spectrum, and wherein each of a second to said Nth sub-spectra sampled signals of said ordinally-arranged set has a sampling density in each dimension of said information component that is a given sub-multiple of a sampling density in that dimension of its immediately preceding sub-spectrum sampled signal of said ordinally-arranged set; said method comprising the steps of:

(a) inserting zero-valued samples into said remnant Nth sub-spectrum sampled signal to expand its sample density in each dimension thereof to that of said bandpass $(N-1)$th sub-spectrum sampled signal, which step introduces undesirable image responses in addition to said remnant $N^{th}$ sub-spectrum resampled to said expanded sample density;

(b) adding respective level values of corresponding samples of said remnant Nth sub-spectrum sampled signal and said bandpass $(N-1)$th sub-spectrum sampled signal to provide a sum sampled signal at the same sampling density in each dimension as that of said bandpass $(N-1)$th sampled signal;

(c) low-pass filtering said sum sampled signal in each dimension thereof to suppress said undesirable image responses and to derive an interpolated-value sampled signal at a sampling density in each dimension thereof that is the same as that of the bandpass $(N-1)$th sampled signal in that dimension, which interpolated-value sampled signal is afforded high-frequency peaking by step (b) of said method;

(d) adding respective level values of corresponding samples of said bandpass $(N-1)$th sub-spectrum sampled signal and said interpolated-value sampled signal to derive an output sampled signal at sampling density in each dimension thereof that is the same as that of the $(N-1)$th bandpass sub-spectrum sampled signal in that dimension, which output sampled signal is equivalent to a remnant $(N-1)$th sub-spectrum sampled signal.

10. The method defined in claim 9, wherein N is equal to two, whereby said output sampled signal derived in step (c) is said second signal temporal sampled signal.

11. The method defined in claim 9, wherein N is greater than two, and wherein said method comprises the further step of:

(d) substituting the output sampled signal derived in step (c) for the remnant sub-spectrum sampled signal of step (a) and successively repeating steps (a), (b) and (c) $(N-2)$ times, whereby the output sampled signal derived by the $(N-2)$th repetition of step (c) is said second single temporal sampled signal.

12. The method defined in claim 11, wherein:
step (c) comprises the step of low-pass filtering in each dimension with a five tap symmetrical, equal contribution kernel weighting function in which the central weighting multiplier coefficient has a value in the range of between 0.3 and 0.4.

13. The method defined in claim 9, wherein:
step (b) comprises the step of low-pass filtering in each dimension with a five tap symmetrical, equal contribution kernel weighting function in which the central weighting multiplier coefficient has a value in the range of between 0.3 and 0.4.

* * * * *